(12) United States Patent
Yoshimatsu et al.

(10) Patent No.: US 11,557,685 B2
(45) Date of Patent: Jan. 17, 2023

(54) LENS-INTEGRATED LIGHT-RECEIVING ELEMENT AND METHOD OF EXAMINING SAME

(71) Applicant: Nippon Telegraph and Telephone Corporation, Tokyo (JP)

(72) Inventors: Toshihide Yoshimatsu, Musashino (JP); Yoshiho Maeda, Musashino (JP); Fumito Nakajima, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 136 days.

(21) Appl. No.: 16/971,230

(22) PCT Filed: Mar. 6, 2019

(86) PCT No.: PCT/JP2019/008753
§ 371 (c)(1),
(2) Date: Aug. 19, 2020

(87) PCT Pub. No.: WO2019/176668
PCT Pub. Date: Sep. 19, 2019

(65) Prior Publication Data
US 2021/0098637 A1    Apr. 1, 2021

(30) Foreign Application Priority Data
Mar. 13, 2018  (JP) .............................. JP2018-045557

(51) Int. Cl.
*H01L 33/00* (2010.01)
*H01L 21/00* (2006.01)
(Continued)

(52) U.S. Cl.
CPC .. *H01L 31/02325* (2013.01); *H01L 27/14627* (2013.01)

(58) Field of Classification Search
CPC .................... H01L 31/02325; H01L 27/14627
(Continued)

(56) References Cited

U.S. PATENT DOCUMENTS

| 6,040,934 A | 3/2000 | Ogusu et al. |
| 8,748,213 B2 * | 6/2014 | Ishioka ............. H01L 27/14621 438/69 |

(Continued)

FOREIGN PATENT DOCUMENTS

| JP | H10-10373 A | | 1/1998 | |
| JP | 2014-48550 | * | 3/2014 | ......... H01L 31/0232 |

(Continued)

OTHER PUBLICATIONS

International Search Report dated Jun. 4, 2019, issued in PCT Application No. PCT/JP2019/008753, filed Mar. 6, 2019.

*Primary Examiner* — Calvin Lee
(74) *Attorney, Agent, or Firm* — Workman Nydegger (57) ABSTRACT

The misalignment between light reception lenses and light reception elements in a lens integrated light reception element for converting a plurality of optical signals with different wavelengths into electric signals is easily inspected. The lens integrated light reception element includes one or more light reception lenses that receive the optical signals, one or more light reception elements each disposed on a main axis of the light reception lens and converting the optical signal into the electric signal, one or more inspection pinholes through which illumination light passes, and one or more inspection lenses each including a main axis parallel to the main axis of the light reception lens and converging the illumination light having passed through the inspection pinhole.

8 Claims, 5 Drawing Sheets

(51) Int. Cl.
*H01L 31/0232* (2014.01)
*H01L 27/146* (2006.01)

(58) Field of Classification Search
USPC .................... 438/16, 31, 35; 257/48, 88, 98
See application file for complete search history.

(56) References Cited

U.S. PATENT DOCUMENTS

2013/0087874 A1* 4/2013 Yomori ............. H01L 27/14685
 257/432
2022/0034714 A1* 2/2022 Okuta ................... G01J 1/4257

FOREIGN PATENT DOCUMENTS

| JP | 2014-48550 A | 3/2014 |
| JP | 2017-97072 A | 6/2017 |
| JP | 2017-103435 A | 6/2017 |

* cited by examiner

Fig. 4

LENS-INTEGRATED LIGHT-RECEIVING ELEMENT AND METHOD OF EXAMINING SAME

TECHNICAL FIELD

The present invention relates to a lens integrated light reception element for converting a plurality of optical signals with different wavelengths into electric signals, and an inspection method regarding the misalignment caused when the lens integrated light reception element is formed.

BACKGROUND ART

In one known structure for achieving a light receiver that converts a fast optical signal into an electric signal, a semiconductor substrate where a light reception element is formed and an optical substrate where an optical component such as a light reception lens is formed are bonded to each other to form a lens integrated light reception element (Patent Literature 1).

Other known structures of light receivers that convert wavelength division multiplexed optical signals collectively into electric signals include a structure in which a semiconductor substrate where a plurality of light reception elements are formed and an optical substrate where a plurality of light reception lenses are formed are bonded to each other in order to convert a plurality of optical signals spatially separated by a wavelength demultiplexer into electric signals, and a structure in which a plurality of light reception lenses and a plurality of light reception elements are integrated monolithically on a single semiconductor substrate (hereinafter referred to as monolithic lens integrated light reception element) (Patent Literature 2). In these structures, one light reception element is assigned for one light reception lens, and an optical signal having entered from the light reception lens is converted into the electric signal by the corresponding light reception element.

Figure 5:
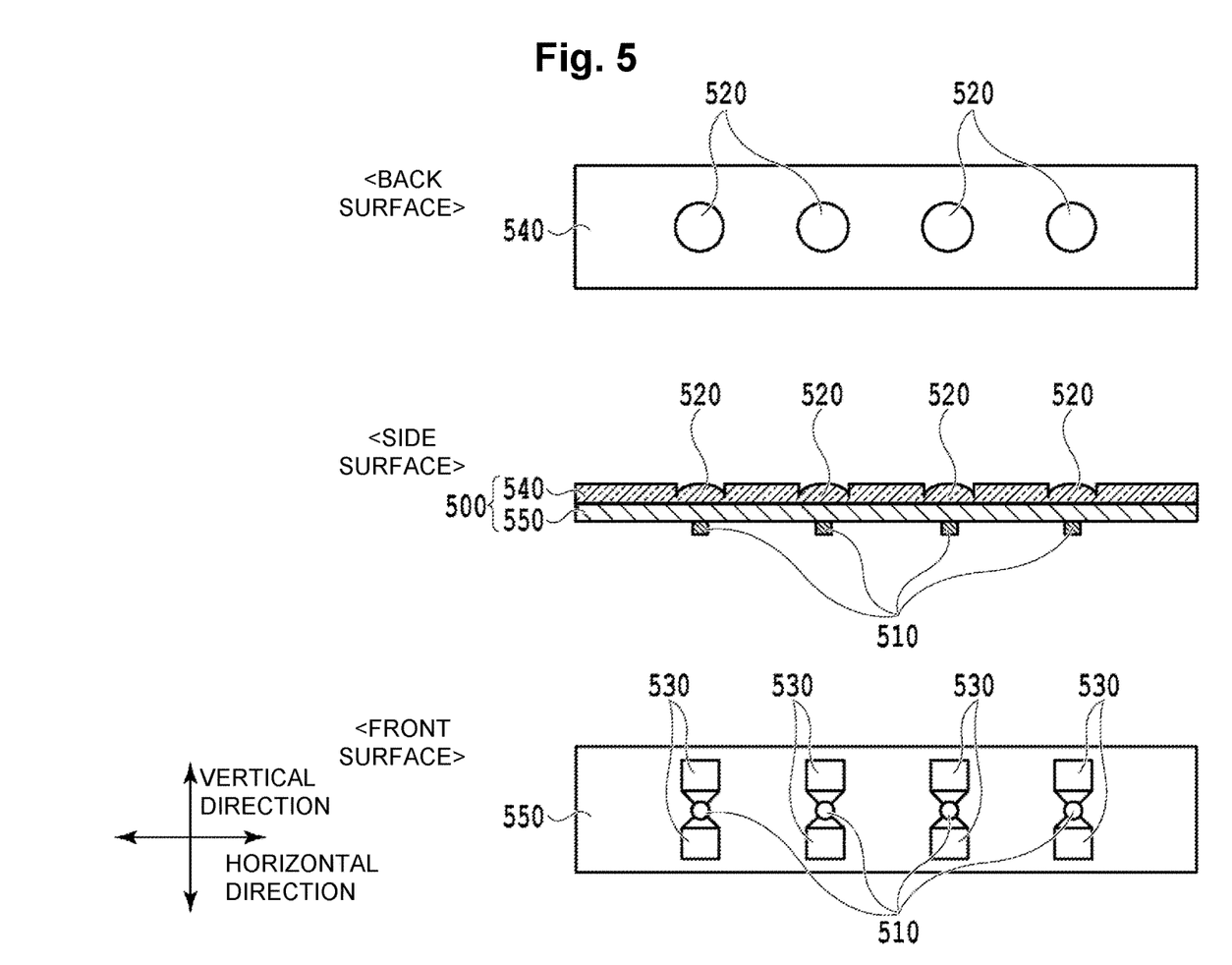
FIG. 5 is a diagram illustrating a structure example of a conventional lens integrated light reception element.

FIG. 5 is a diagram illustrating a structure example of a conventional lens integrated light reception element 500. In the structure of the lens integrated light reception element 500 in FIG. 5, the lens integrated light reception element 500 is manufactured by bonding a semiconductor substrate 550 where a plurality of light reception elements 510 are formed and an optical substrate 540 where a plurality of light reception lenses 520 are formed. Here, in order to explain the positional relation between the light reception elements 510 and the light reception lenses 520, a surface of the semiconductor substrate 550 where the light reception elements 510 are formed is defined as "a front surface" of the lens integrated light reception element 500. Then, the light reception lenses 520 provided to the optical substrate 540 are disposed on "a back surface" of the lens integrated light reception element 500.

The light reception elements 510 formed on the semiconductor substrate 550 and the light reception lenses 520 formed on the optical substrate 540 can be manufactured using a semiconductor exposure device. The semiconductor exposure device has high accuracy in accordance with the high positioning accuracy of a wafer stage in the semiconductor exposure device about the positioning in a direction where the semiconductor substrate 550 and the optical substrate 540, which are approximately flat plates, extend, that is, in a horizontal direction in FIG. 5 in the manufacture of the light reception elements 510 and the light reception lenses 520. Therefore, the light reception elements 510, which are manufactured by the semiconductor exposure device, are manufactured with high positioning accuracy in the horizontal direction on the semiconductor substrate 550, and similarly the light reception lenses 520 are manufactured on the optical substrate 540 with high positioning accuracy in the horizontal direction.

CITATION LIST

Patent Literatures

Patent Literature 1: Japanese Patent Laid-Open No. 2017-103435

Patent Literature 2: Japanese Patent Laid-Open No. 2017-97072

SUMMARY OF THE INVENTION

Technical Problem

On the other hand, the accuracy of the arrangement in the horizontal direction between the light reception elements 510 formed on the front surface side of the lens integrated light reception element 500 and the corresponding light reception lenses 520 formed on the back surface side thereof (hereinafter this accuracy is referred to as "element-lens arrangement accuracy") is easily affected by the rotational displacement in the bonded surface or the misalignment in the horizontal direction that is caused when the semiconductor substrate 550 and the optical substrate 540 are bonded to each other.

Regarding another conventional structure of the monolithic lens integrated light reception element that is different from the structure in FIG. 5, the positional relation between the light reception element and the light reception lens is described using the direction indicated in FIG. 5. The light reception elements are formed on the front surface side of the semiconductor substrate and the light reception lenses are formed on the back surface side of the semiconductor substrate. The semiconductor exposure device is also used when this monolithic lens integrated light reception element is manufactured.

When the light reception elements are manufactured on the front surface side of the semiconductor substrate and the light reception lenses are manufactured on the back surface side thereof, the element-lens arrangement accuracy of the light reception elements and the light reception lenses that are manufactured is easily affected by the rotational displacement or the misalignment that is caused in the light exposure to each surface.

That is to say, in the case of manufacturing the conventional structure in FIG. 5 and the structure of the conventional monolithic lens integrated light reception element, the manufacturing positions of light reception elements formed on the semiconductor substrate and the light reception lenses formed on the optical substrate have the high accuracy in the horizontal direction; however, in the case where the lens integrated light reception element is formed using these elements and lenses, the element-lens arrangement accuracy is low.

A method for inspecting the element-lens arrangement accuracy using the structure of the conventional lens integrated light reception element illustrated in FIG. 5 is described. In order to inspect the positioning accuracy between the light reception elements 510 formed on the front surface side and the light reception lenses 520 formed on the back surface side, that is, the element-lens arrangement accuracy, the following process is necessary: first, a light incidence device including an optical system equivalent to a designed light receiver, that is, a dedicated inspection device is prepared, and then light is delivered to the light reception element 510 on the front surface side of the lens integrated light reception element 500 through the light reception lens 520 formed on the back surface side thereof, the photocurrent is detected at an electrode 530 formed on the front surface side and connected electrically to the light reception element 510, the value is measured, and thus, the light reception sensitivity is evaluated. Then, based on this light reception sensitivity, the element-lens arrangement accuracy of the lens integrated light reception element is inspected.

In this conventional method for inspecting the element-lens arrangement accuracy of the lens integrated light reception element, the work of optically aligning the dedicated inspection device or the work of turning electricity from the electrode 510 is necessary for each of the light reception elements 520; thus, the inspecting process takes time, which is a problem. Furthermore, the inspecting work costs high due to the above problem.

The present invention has been made in view of the above problems, and an object is to easily inspect the misalignment between the light reception lens and the light reception element in the lens integrated light reception element for converting a fast wavelength division multiplexed signal into an electric signal.

Means for Solving the Problem

One embodiment of the present invention provides a lens integrated light reception element including one or more light reception lenses that receive an optical signal, one or more light reception elements each disposed on a main axis of the light reception lens and converting the optical signal into an electric signal, one or more inspection pinholes through which illumination light passes, and one or more inspection lenses each including a main axis parallel to the main axis of the light reception lens and converging the illumination light having passed through the inspection pinhole.

Another embodiment of the present invention is an inspection method for a lens integrated light reception element for converting a fast wavelength division multiplexed signal into an electric signal. First, a pinhole image is generated by making illumination light for inspection pass through one or more inspection pinholes and making the illumination light having passed through the inspection pinhole transmit through one or more inspection lenses and form an image. Next, the pinhole image projected to an observation plane, which is orthogonal to a main axis of the inspection lens, and the inspection lens projected to the observation plane are compared.

Here, whether there is a misalignment between the light reception lens and the light reception element is determined based on whether a center of the pinhole image projected to the observation plane and a center of the inspection lens projected to the observation plane coincide with each other.

On the other hand, if the center of the pinhole image projected to the observation plane and the center of the inspection lens projected to the observation plane do not coincide with each other, it is determined that the misalignment occurs between the light reception lens and the light reception element.

Effects of the Invention

According to the present invention, the inspection about the arrangement accuracy between the light reception elements and the light reception lenses can be performed at the same time for the light reception lenses and the corresponding light reception element lens integrated light reception element, and thus, the inspection takes shorter time than in the conventional inspection method.

In addition, it is unnecessary to prepare a dedicated inspection device including an optical system equivalent to a designed light receiver in order to inspect the arrangement accuracy between the light reception element and the light reception lens, and thus, the cost for the inspection can be reduced.

DESCRIPTION OF EMBODIMENTS

An object of the present invention is to collectively inspect a lens integrated light reception element including a plurality of light reception lenses and a plurality of corresponding light reception elements about the positioning accuracy between the light reception elements and the light reception lenses in a structure of the lens integrated light reception element, that is, the element-lens arrangement accuracy.

One embodiment of the invention of a lens integrated light reception element and an inspection method for the lens integrated light reception element using that is described below. The embodiment of the present invention to be described below is one example and in addition to the best mode for carrying out the present invention, other structures are also applicable unless departing from the scope of the present invention.

Figure 1:
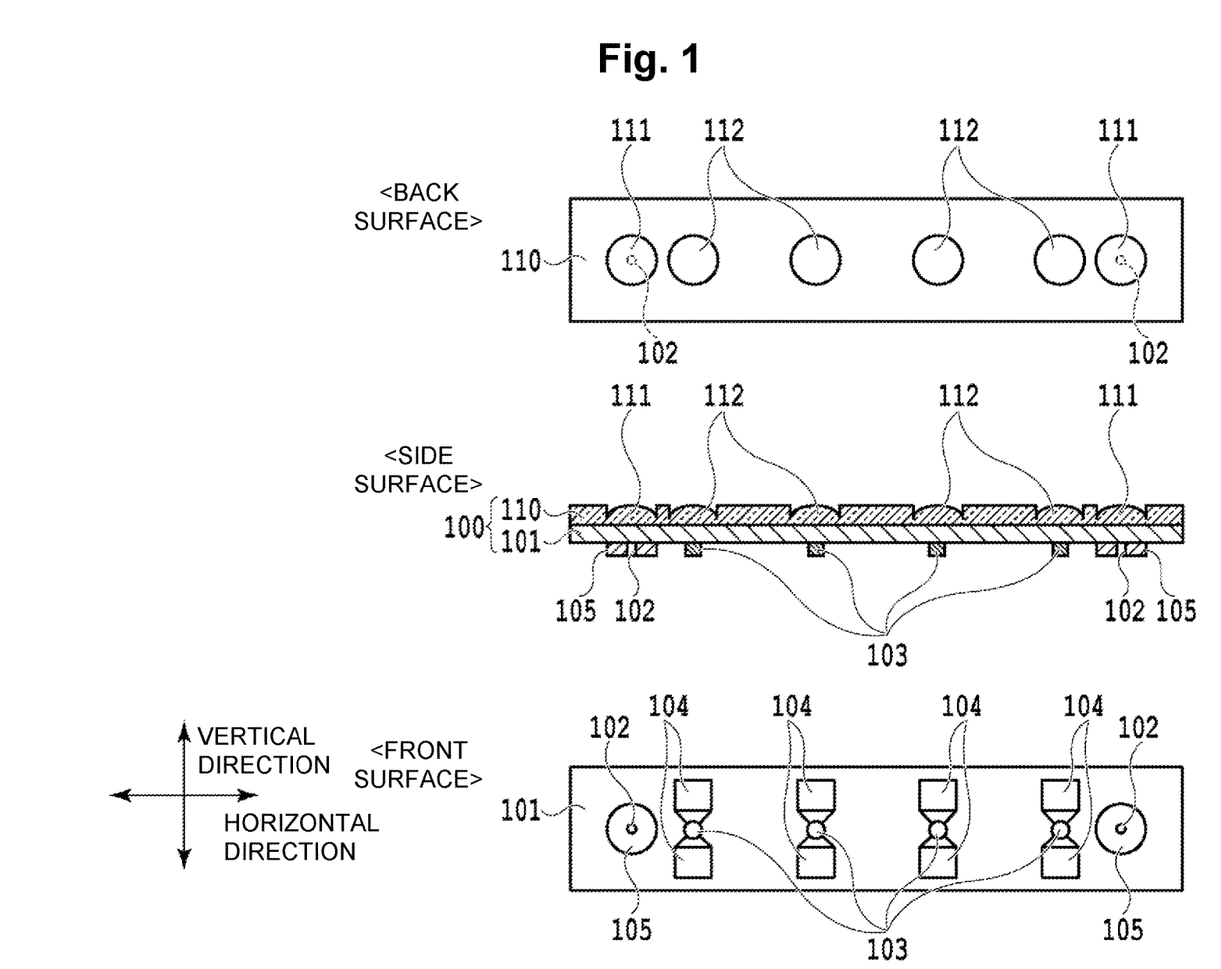
FIG. 1 is a diagram illustrating a structure of a lens integrated light reception element according to one embodiment of the present invention.

FIG. 1 is a diagram illustrating a structure of a lens integrated light reception element 100, which corresponds one embodiment of the present invention, manufactured by bonding a semiconductor substrate 101 where a plurality of light reception elements 103 are formed and an optical substrate 110 where a plurality of light reception lenses 112 are formed. The structure of the lens integrated light reception element 100 is different from the structure of the conventional lens integrated light reception element 500 illustrated in FIG. 5 in that the lens integrated light reception element 100 includes an inspection lens 111, an inspection pinhole formation member 105, and an inspection pinhole 102 formed by the inspection pinhole formation member 105.

In the structure illustrated in FIG. 1, the lens integrated light reception element 100 includes the four light reception elements 103 and the four light reception lenses 112 corresponding to the four light reception elements 103. Moreover, the lens integrated light reception element 100 includes the two inspection lenses 111 and the two inspection pinhole formation members 105 corresponding to the two inspection lenses 111 at both ends of the lens integrated light reception element 100 in the horizontal direction.

Each of the inspection pinhole formation members 105 is formed on a front surface side of the lens integrated light reception element 100 and each of the inspection lenses 111 is formed on a back surface side of the lens integrated light reception element 100. The inspection pinhole formation member 105 is a metal member formed on the semiconductor substrate 101 that is disposed on the back surface side of the lens integrated light reception element 100, that is formed to stand on the semiconductor substrate 101 in a vertical direction, and that includes a hole, in other words, the inspection pinhole 102 penetrating a surface parallel to the semiconductor substrate 101.

The four light reception lenses 112 and the two inspection pinholes 102 are manufactured on the same surface of the semiconductor substrate 101 that is disposed on the front surface side of the lens integrated light reception element 100. In the case of manufacturing the four light reception elements 103 and the two inspection pinholes 102 using the semiconductor exposure device, the displacement from the target manufacturing position in the horizontal direction is very small, and therefore the light reception elements 103 and the inspection pinholes 102 are manufactured with high positioning accuracy in the horizontal direction.

In addition, the four light reception lenses 112 and the two inspection lenses 111 are manufactured on the same surface of the optical substrate 110 disposed on the back surface side of the lens integrated light reception element 100. In the case of manufacturing the four light reception lenses 112 and the two inspection lenses 111 using the semiconductor exposure device in a manner similar to when the light reception elements 103 and the inspection pinholes 102 are manufactured, the light reception lenses 112 and the inspection lenses 111 are manufactured with the high positioning accuracy in the horizontal direction.

Here, since the inspection pinhole formation member 105 is formed of the same metal material as the metal material used when the light reception elements are manufactured, forming the inspection pinhole 102 does not require a special extra step in the conventional manufacturing process, and the inspection pinhole 102 can be manufactured at the same time as the light reception element 103. One preferable example of the metal material is gold. When gold, which is the same material as an electrode 104, is used, the inspection pinhole formation member 105 can be manufactured at the same time as the light reception element 103 and moreover, the inspection pinhole formation member 105 can be manufactured at the same time as the electrode 104. Therefore, the complication in the manufacturing process and the increase in the number of steps can be prevented.

In addition, the inspection lens 111 is a convex lens, which is the same as the light reception lens 112; therefore, forming the inspection lens 111 does not require a special extra step and the inspection lens 111 can be manufactured at the same time as the light reception lens 112.

Next, one embodiment of the inspection method according to the present invention is described.

An object of the inspection method according to the present invention is to inspect, in the state where the semiconductor wafer substrate where the light reception elements are formed and the optical wafer substrate where the lenses are formed are bonded to each other, the element-lens arrangement accuracy, which corresponds to the arrangement accuracy between the light reception elements and the corresponding light reception lenses, at the same time for the light reception lenses and the corresponding light reception elements.

Figure 2:
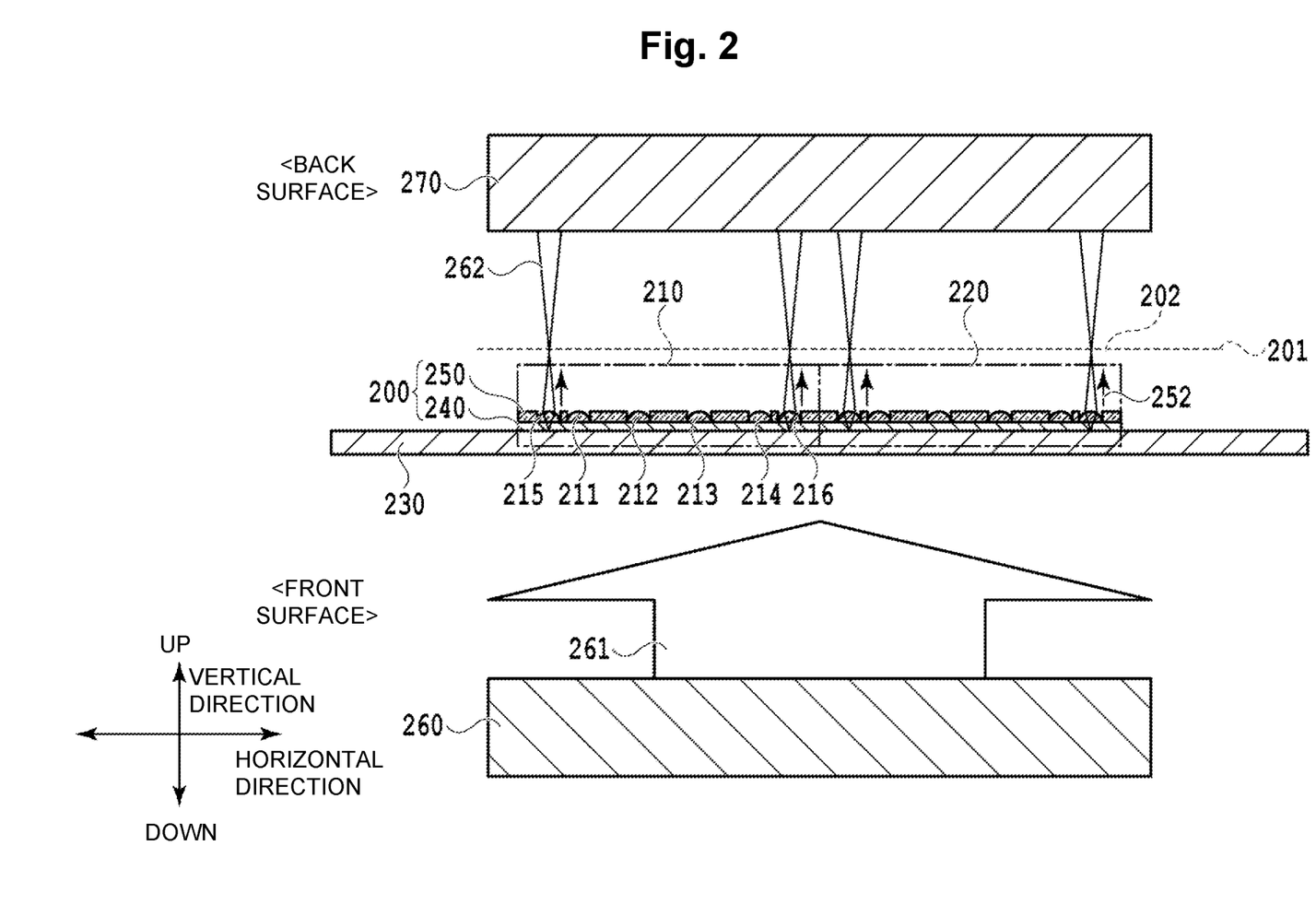
FIG. 2 is a diagram illustrating an inspection method for the lens integrated light reception element according to one embodiment of the present invention.

FIG. 2 is a diagram illustrating the inspection method for the element-lens arrangement accuracy of the lens integrated light reception element 100 according to the present invention illustrated in FIG. 1. The inspection method illustrated in FIG. 2 is employed in a process for manufacturing a wafer in which an optical substrate 250 and a semiconductor substrate 240 are bonded to each other. Although the plurality of lens integrated light reception elements are manufactured in one wafer in the actual wafer manufacturing process, FIG. 2 illustrates as follows to simplify the description: a four-channel lens integrated light reception element 210 including four light reception lenses 211, 212, 213, and 214, four light reception elements (not shown) corresponding to these lenses, and two inspection lenses 215 and 216 is regarded as one chip, and two chips of four-channel lens integrated light reception elements 210 and 220 are formed on a wafer 200.

The four-channel lens integrated light reception element 210 that is positioned on the left side in the horizontal direction in FIG. 2 is described below.

First, the wafer 200 is placed on a wafer holder plate 230, which extends in the horizontal direction, so that the semiconductor substrate 240 is disposed on a lower side in the vertical direction and the optical substrate 250 is disposed on an upper side in the vertical direction. Next, illumination light 261 emitted from an illumination 260 is delivered to the lens integrated light reception element 210 from the lower side in the vertical direction. Thus, the illumination light 261 having passed through the inspection pinhole 102 illustrated in FIG. 1 transmits through the inspection lenses 215 and 216 and forms an image on an image formation plane 201. Here, by focusing the light with the image formation plane 201 and a focal plane 202 of an inspection camera 270 coinciding with each other, the image formed by the inspection pinhole 102 (hereinafter referred to as pinhole image) can be observed using the inspection camera 270. By observing this pinhole image, the position accuracy between the inspection pinhole and the inspection lenses 215 and 216 in the horizontal direction can be inspected.

Here, the illumination light 261 has single wavelength or a wavelength band that optically transmits through the semiconductor substrate 240 and the optical substrate 250 and does not optically transmit through the pinhole formation member. The wavelength of the illumination light 261 employed in the inspection method according to the present invention is an average wavelength (for example, 1300 nm) of the wavelength division multiplexed signal light in the case of the single wavelength, and in the case of the wavelength band, the wavelength is preferably the wavelengths ranging from the average wavelength of the wavelength division multiplexed signal light to a half thereof (for example, 650 nm to 1300 nm).

In the case where the wavelengths of the illumination light 261 have a bandwidth, determining the wavelength range as above enables the observation of the pinhole image in the visible light range, and furthermore, the structure of the inspection camera 270 can be simplified, which is advantageous.

That is to say, by inspecting the position accuracy in the horizontal direction between the inspection pinhole and the inspection lens, the accuracy of the arrangement in the horizontal direction between the light reception elements manufactured at the same time as the inspection pinhole formation members and the light reception lenses 211, 212, 213, and 214 manufactured at the same time as the inspection lenses 215 and 216, that is, the element-lens arrangement accuracy can be inspected indirectly.

Figures 3A, 3B:
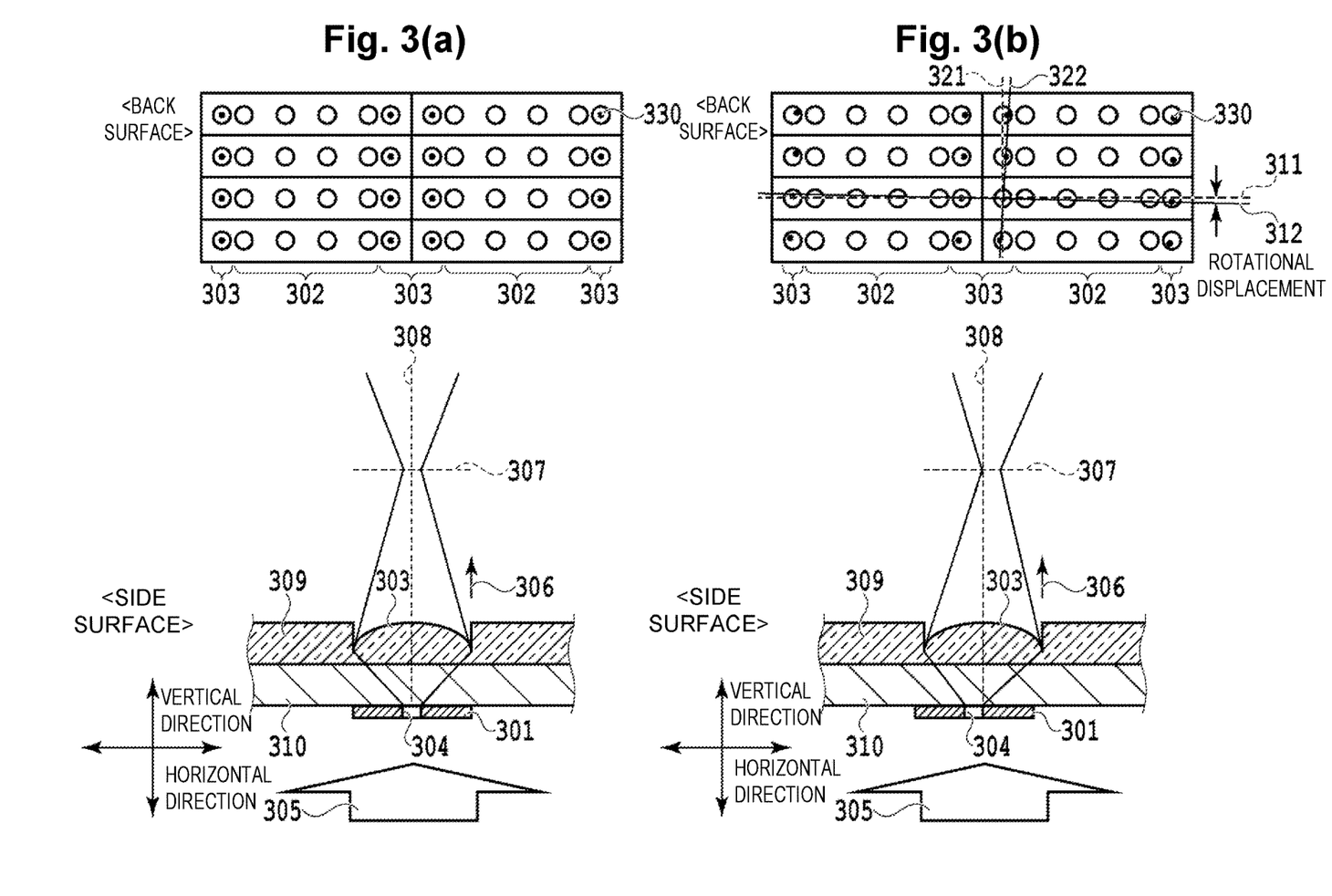
FIG. 3 is a diagram illustrating a state of image formation of a pinhole image in the inspection method for the lens integrated light reception element according to one embodiment of the present invention.

FIG. 3(a) and FIG. 3(b) are diagrams each illustrating a state of image formation of the pinhole image acquired in the inspection method illustrated in FIG. 2. FIG. 3(a) illustrates a case in which the accuracy of the arrangement in the horizontal direction between the light reception elements and the corresponding light reception lenses 302 is high, that is, the element-lens arrangement accuracy is high, and FIG. 3(b) illustrates a case in which the element-lens arrangement accuracy is low because of the influence from the rotational displacement due to the misalignment when the semiconductor substrate and the optical substrate are bonded to each other or the rotational displacement due to the misalignment in the light exposure on the front and back surfaces when the monolithic lens integrated light reception element is manufactured.

First, the case in which the element-lens arrangement accuracy is high is described. As illustrated in FIG. 3(a), illumination light 305 having passed through an inspection pinhole 304 transmits through an inspection lens 303 and the resulting transmission light 306 forms an image on an image formation plane 307, and thus, a pinhole image 330 is obtained. The pinhole image 330 obtained here is circular when observed from the back surface that is parallel to a plane with a normal line that is substantially parallel to the vertical direction, and the pinhole image 330 is formed on the image formation plane 307 so that a lens main axis 308 passes the center of the circle in the vertical direction. As illustrated in FIG. 3(a), the pinhole image 330 is observed on the image formation plane 307 so that the center of the inspection lens 303 coincides with the center of the pinhole image 330.

The state of this pinhole image 330 means that a cylinder center axis of the inspection pinhole with a cylindrical shape the illumination light 305 passes coincides with the lens main axis 308 of the inspection lens 303, that is, the element-lens arrangement accuracy is high.

Next, the case in which the element-lens arrangement accuracy is low is described. As illustrated in FIG. 3(b), similarly to the case of FIG. 3(a), the illumination light 305 having passed through the inspection pinhole 304 transmits through the inspection lens 303 and the resulting transmission light 306 forms the image on the image formation plane 307, and thus, a pinhole image 304 is obtained. The pinhole image 330 obtained here is circular when observed from the back surface that is parallel to a plane with a normal line that is substantially parallel to the vertical direction. The center of the circular pinhole image that is observed here does not pass the lens main axis 308 and is formed as the image on the image formation plane 307.

That is to say, as illustrated in FIG. 3(b), the pinhole image is observed so that the center of the inspection lens 302 and the center of the pinhole image 330 do not coincide with each other on the image formation plane 307.

The state of this pinhole image 330 means that the cylinder center axis of the inspection pinhole 304 with a cylindrical shape the illumination light 305 passes and the lens main axis 308 of the inspection lens 303 are displaced from each other in the horizontal direction, that is, the element-lens arrangement accuracy is lower than that in FIG. 3(a).

Therefore, the element-lens arrangement accuracy can also be qualitatively inspected by making the illumination light 305 pass the inspection pinhole 304 formed by an inspection pinhole formation member 301, and observing the state of the image formation of the pinhole image 330 on the image formation plane 307 by the transmission light 306 resulting from the transmission of the light through the inspection lens 303.

Furthermore, the case in which the rotational displacement has occurred in the in-plane direction with a normal line that is substantially parallel to the vertical direction when a semiconductor substrate 310 and an optical substrate 309 are bonded to each other as illustrated in FIG. 3(b) is described in detail. First, the lens integrated light reception element is observed from the back surface side and a line segment 311 traversing horizontally centers of the circular inspection lenses 303 and a line segment 321 traversing vertically the centers of the circular inspection lenses 303 are acquired as reference lines. Next, a line segment 312 traversing horizontally centers of the circular pinhole images 330 formed on the image formation plane 307 and a line segment 322 traversing vertically the centers of the circular pinhole images 330 are acquired as inspection lines.

Here, by measuring the angle between the reference line 311 and the inspection line 312 and the angle between the reference line 321 and the inspection line 322, the degree of the rotational displacement generated when the semiconductor substrate 310 and the optical substrate 309 are bonded to each other can be quantitatively inspected.

Specifically, the accuracy of the inspected rotational displacement is affected by the conditions including the curvature of the inspection lens 303, which is the convex lens, the wavelength of the illumination light 305, the diameter of the inspection pinhole 304, the reflection of the illumination light 305 near the inspection pinhole 304 of the inspection pinhole formation member 301, and the distance between the centers of the inspection lenses 303, and it is apparent that the inspected quantitative rotational displacement can be derived quantitatively from the geometric optical point of view in FIG. 3(a) and FIG. 3(b).

Figure 4:
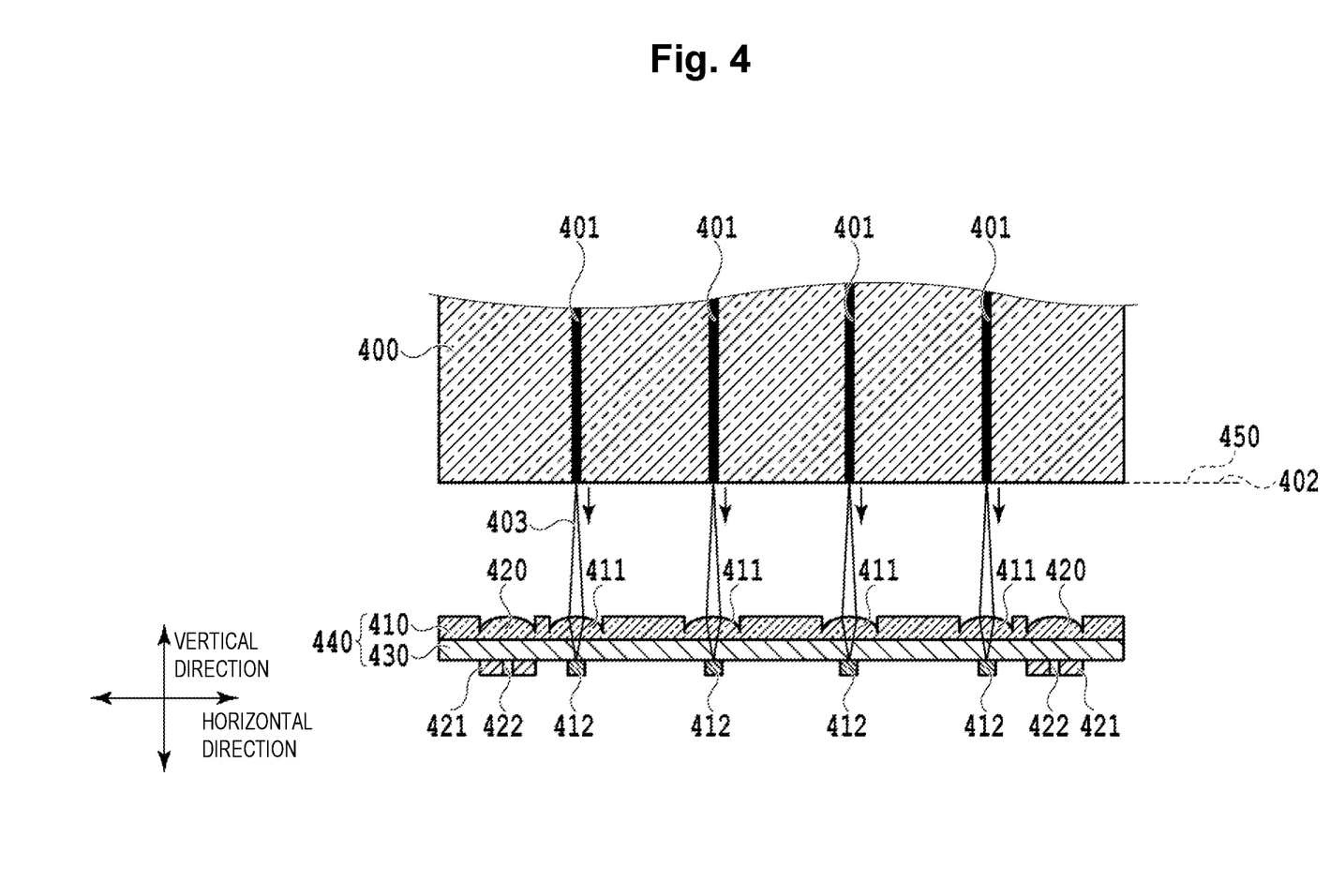
FIG. 4 is a diagram illustrating one example in which the lens integrated light reception element according to one embodiment of the present invention is used for a light receiver.

FIG. 4 illustrates one embodiment in which a lens integrated light reception element 440 with the same structure as that in FIG. 1 is used for a light receiver that, upon the input of wavelength division multiplexed optical signals, converts the signals with the wavelengths multiplexed into the electric signals at the same time. By a plurality of optical waveguides 401 formed on an optical waveguide substrate 400 in a wavelength demultiplexer, a plurality of signal light rays 403 that are separated spatially are emitted from an emission surface 402 of the optical waveguides 401 in a vertical direction. The emitted signal light rays 403 are converged by a plurality of light reception lenses 420 formed on the optical substrate 410, and input to light reception elements 412 corresponding to the respective light reception lenses 420, and converted into the electric signals.

Here, an inspection pinhole formation member 421, an inspection pinhole 422, and an inspection lens 420, which are the characteristics of the present invention, are provided at both ends of the lens integrated light reception element 440 in the horizontal direction; thus, the light reception lenses 411 and the corresponding light reception elements 412 are separated from each other. Therefore, it is apparent that the inspection pinhole formation member 421, the inspection pinhole 422, and the inspection lens 420 do not block the signal light ray 403 that enters the light reception lens 411 and do not affect the photoelectric conversion function of the lens integrated light reception element 440 that is the light receiver.

In the inspection method in FIG. 2 and FIG. 3, transmission light 252 and 306 of the illumination light 261 and 305 transmit through the inspection lenses 215, 216, and 303 and form the image on the image formation planes 201 and 307; on the other hand, in the lens integrated light reception element 440 in FIG. 4, the signal light ray 403 is received in the light reception lens 411 and converged thereby.

That is to say, in the case where the shape of the inspection lens and the shape of the light reception lens to be manufactured on the optical substrate are the same, the distance between the image formation planes 201 and 307 of the pinhole images in FIG. 2 and FIG. 3 and the apex of the inspection lens that is the convex lens coincides with the distance between the emission surface 402 of the optical waveguides 401 and the apex of the light reception lens that is the convex lens in FIG. 4.

That is to say, the lens integrated light reception element according to the present invention does not require an extra step of designing another lens or another manufacturing process in manufacturing the inspection lens in addition to the conventional light reception lens. Therefore, the inspection lens can be provided at low cost and thus, the inspection using the same is easier than the conventional method.

REFERENCE SIGNS LIST 100, 440, 500 Lens integrated light reception element
101, 240, 310, 430, 550 Semiconductor substrate
102, 304, 422 Inspection pinhole
103, 412, 510 Light reception element
104, 530 Electrode
105, 301, 421 Inspection pinhole formation member
110, 250, 309, 410, 540 Optical substrate
111, 215, 216, 303, 420 Inspection lens
112, 211, 212, 213, 214, 302, 411, 520 Light reception lens
200 Wafer
201, 307 Image formation plane
202 Focal plane
210, 220 Four-channel lens integrated light reception element
230 Wafer holder plate
252, 306 Transmission light
260 Illumination
261, 305 Illumination light
270 Inspection camera
308 Lens main axis
311, 321 Reference line
312, 322 Inspection line
330 Pinhole image
400 Optical waveguide substrate
401 Optical waveguide
402 Emission surface of optical waveguide 401
403 Signal light ray

The invention claimed is:

1. A lens integrated light reception element that converts a plurality of optical signals with different wavelengths into electric signals, the lens integrated light reception element comprising:
one or more light reception lenses that receive the optical signals;
one or more light reception elements each disposed on a main axis of the light reception lens and converting the optical signal into the electric signal;
one or more inspection pinholes through which illumination light passes; and
one or more inspection lenses each including a main axis parallel to the main axis of the light reception lens and converging the illumination light having passed through the inspection pinhole,
wherein a distance between a first one of the inspection lenses to a first one of the light reception lenses that is closest to the first one of the inspection lenses is less than a distance between the first one of the light reception lenses and a second one of the light reception lenses that is adjacent to the first one of the light reception lenses.

2. The lens integrated light reception element according to claim 1, wherein
the light reception lenses and the inspection lenses are formed on a same light-transmitting substrate, and
the light reception elements and the inspection pinholes are formed on a same semiconductor substrate.

3. The lens integrated light reception element according to claim 2, wherein the inspection pinhole is a hole that penetrates a surface, which is parallel to the semiconductor substrate, of an inspection pinhole formation member standing in a vertical direction on the semiconductor substrate.

4. The lens integrated light reception element according to claim 3, wherein the inspection pinhole formation member includes metal and the metal is the same as metal included in the light reception element.

5. The lens integrated light reception element according to claim 1, wherein
the light reception lenses and the inspection lenses are disposed on a first plane that is orthogonal to the main axis of the light reception lens, and
the light reception elements and the inspection pinholes are disposed on a second plane that is orthogonal to the main axis of the light reception lens.

6. The lens integrated light reception element according to claim 5, wherein
the light reception lenses and the inspection lenses are formed on a same light-transmitting substrate, and
the light reception elements and the inspection pinholes are formed on a same semiconductor substrate.

7. The lens integrated light reception element according to claim 5, wherein the light reception lenses and the inspection lenses are convex lenses.

8. The lens integrated light reception element according to claim 7, wherein
the light reception lenses and the inspection lenses are formed on a same light-transmitting substrate, and
the light reception elements and the inspection pinholes are formed on a same semiconductor substrate.

* * * * *